(12) United States Patent
Nathan et al.

(10) Patent No.: US 7,242,398 B2
(45) Date of Patent: Jul. 10, 2007

(54) FLEXIBLE DISPLAY DEVICE

(75) Inventors: Arokia Nathan, Waterloo (CA); Denis Striakhilev, Waterloo (CA)

(73) Assignee: Ignis Innovation Inc., Waterloo, Ontario (CA)

( * ) Notice: Subject to any disclaimer, the term of this patent is extended or adjusted under 35 U.S.C. 154(b) by 201 days.

(21) Appl. No.: 10/468,321

(22) PCT Filed: Feb. 18, 2002

(86) PCT No.: PCT/CA02/00181

§ 371 (c)(1),
(2), (4) Date: Jan. 26, 2004

(87) PCT Pub. No.: WO02/067329

PCT Pub. Date: Aug. 29, 2002

(65) Prior Publication Data

US 2004/0124763 A1    Jul. 1, 2004

(51) Int. Cl.
*G09G 5/00* (2006.01)
*G09G 3/30* (2006.01)

(52) U.S. Cl. ........................................ 345/206; 345/87
(58) Field of Classification Search ................ 345/31, 345/55, 76, 82, 87, 206; 349/56
See application file for complete search history.

(56) References Cited

U.S. PATENT DOCUMENTS 5,747,928 A    5/1998 Jeffrey et al.

6,323,832 B1 * 11/2001 Nishizawa et al. ............ 345/83
6,468,638 B2 * 10/2002 Jacobsen et al. ............ 428/209

FOREIGN PATENT DOCUMENTS

| GB | 2 205 431 A | 12/1988 |
|----|-------------|---------|
| GB | 2 205 431   | 12/1998 |

OTHER PUBLICATIONS

MA E Y et al: "Organic Light-Emitting Diode/Thin Film Transistor Integration For Foldable Displays" Conference Record of the 1997 International Display Research Conference and International Workshops on LCD Technology and Emissive Technology. Toronto, Sep. 15-19, 1997, International Display Research Conference (IDRC), Santa Ana, CA, SID, US, vol. Conf. 17, Sep. 15, 1997, pp. 78-81, XP000931235.

* cited by examiner

*Primary Examiner*—Dennis-Doon Chow
(74) *Attorney, Agent, or Firm*—Pearne & Gordon LLP

(57) ABSTRACT

A flexible display device (10) is disclosed. The flexible display device comprises a flexible substrate (12), a number of display pixels (14) arranged in a form of rows and columns on the surface of the substrate, a number of grooves (16) in the surface of the substrate each of which is formed in between adjacent two rows or columns of the display pixels (14), and connection lines (18) for electrically interconnecting the plurality of display pixels (14), thereby providing flexibility to the display device and, at the same time, minimizing the propagation of mechanical stress caused when the display device is bent or rolled. A method of manufacturing the display device is also disclosed.

11 Claims, 10 Drawing Sheets

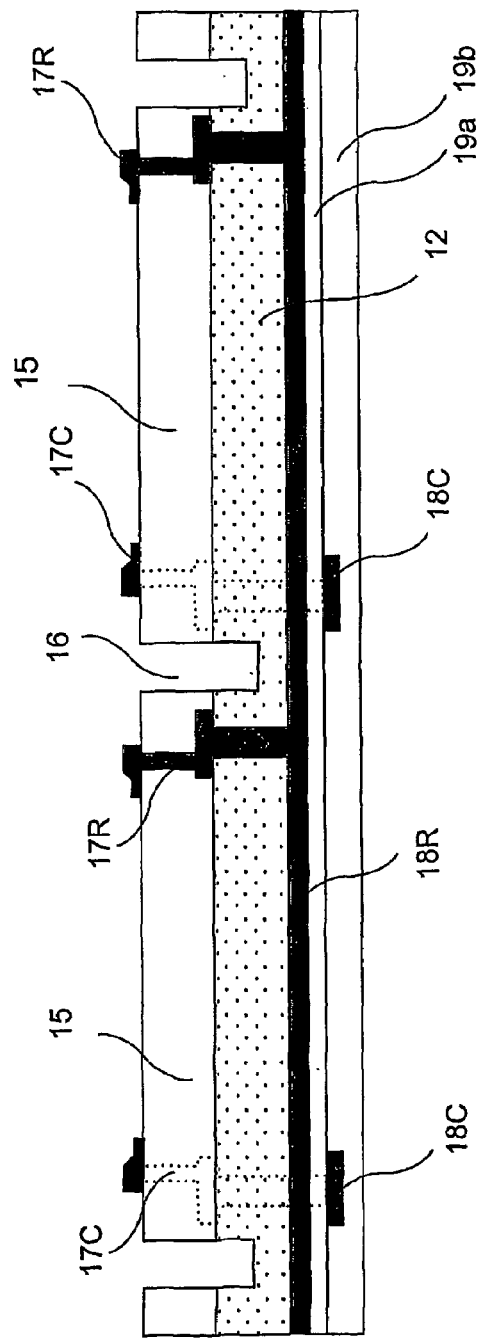
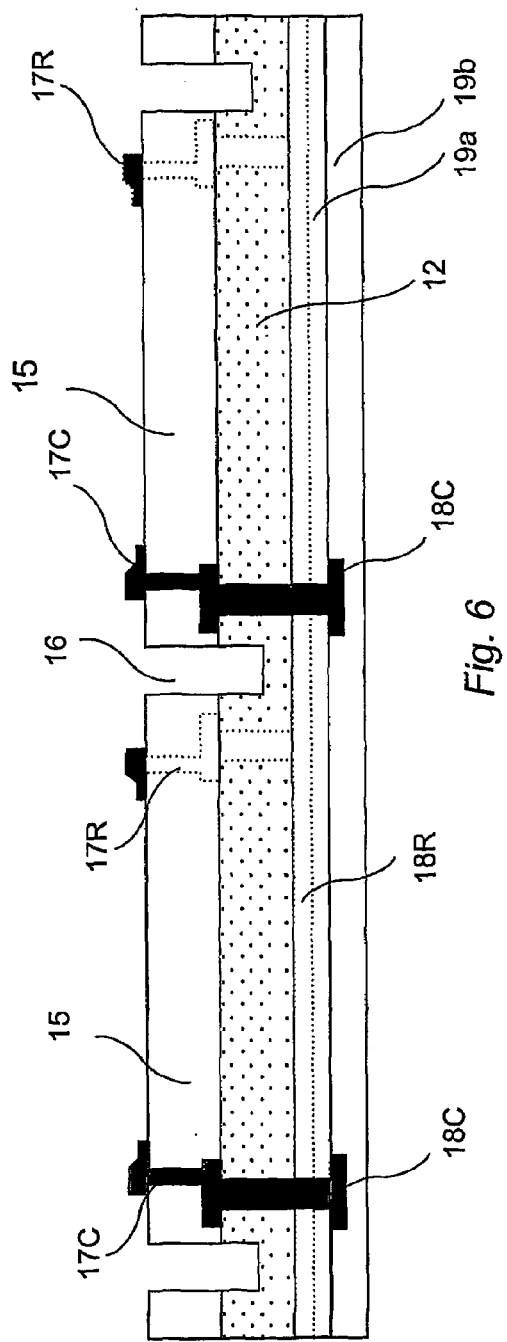
Fig. 5
Fig. 6

FLEXIBLE DISPLAY DEVICE

FIELD OF THE INVENTION

The present invention relates generally to a display device. More particularly, the invention relates to a flexible display device, which can be rolled up in a preferential direction. The invention also relates to a method of manufacturing such flexible display devices.

BACKGROUND OF THE INVENTION

In general, a display panel device consists of a substrate layer, a number of display pixels disposed on the surface of the substrate, and pixel switching circuitry. The display pixels are arranged in a form of plural rows and columns.

Conventionally, flexible substrates such as a plastic substrate have been utilized to provide a mechanical flexibility to display devices. However, there has been a limitation to the degree of flexibility since the flexibility of the display panel relies on only that of the plastic substrate. In addition, the mechanical stress caused by bending or flexing is propagated throughout the whole displaying area, particularly the display pixels. Therefore, the display performance characteristics of the pixels are adversely affected so that it can not work properly as a display device, especially when excessively bent or severely flexed.

Accordingly, there is a need to solve the conventional problems noted above and to provide a novel flexible display device in which its flexibility can be maximized and the propagation of mechanical stress can be minimized, without damaging the display performance.

SUMMARY OF THE INVENTION

According to one aspect of the present invention, there is provided a flexible display device. The display device comprises (a) a flexible substrate; (b) a plurality of display pixels arranged in a form of rows and columns on the surface of the substrate; (c) a plurality of first grooves in the surface of the substrate, the first groove being formed in between adjacent two rows or columns of the display pixels, thereby providing flexibility to the display device and, at the same time, minimizing the propagation of mechanical stress caused when the display device is bent or rolled; and (d) a plurality of connection lines for electrically interconnecting the plurality of display pixels. The display device can further include a plurality of second grooves, each of which is formed in between adjacent two columns or rows of the display pixels thereby enhancing the flexibility of the display device, the first and second grooves being substantially perpendicular to each other.

According to another aspect of the present invention, there is provided a flexible display device. The display device comprises (a) a flexible substrate having a first and second surfaces; (b) a plurality of display pixels arranged in a form of rows and columns on the first surface of the substrate; (c) a plurality of first parallel grooves in the first surface of the substrate, the first groove being formed in between adjacent two rows or columns of the display pixels, thereby providing flexibility to the display device and, at the same time, minimizing the propagation of mechanical stress caused when the display device is bent or rolled; and (d) a plurality of connection lines for electrically interconnecting the plurality of display pixels. The connection lines comprise: (a) a plurality of row connection lines provided on the second surface of the substrate, each row connection line corresponding to each respective row of display pixels; (b) a plurality of column connection lines provided on the second surface of the substrate, each column connection line corresponding to each respective column of display pixels; and (c) a plurality of vertical connection lines each connecting each display pixel on the first surface with a corresponding row or column connection line on the second surface, wherein an insulation layer is provided between the row and column connection lines.

According to one aspect of the present invention, there is provided a method of manufacturing a flexible display device. The method comprises the steps of: (a) providing a flexible substrate having a first and second surface; (b) forming a plurality of first parallel grooves in the first surface of the substrate, each adjacent two parallel grooves defining a pixel area therebetween; (c) providing a plurality of display pixels on the pixel area such that the display pixels are arranged in a pattern of rows and columns; and (d) providing a plurality of connection lines to electrically interconnect the display pixels. The method can further include a step of forming a plurality of second parallel grooves in the first surface of the substrate such that the second groove is substantially perpendicular to the first groove. The step of providing a plurality of connection line comprises steps of: (a) providing a first connection line to connect the first surface with the second surface of the substrate; and (b) providing a second connection line on the second surface of the substrate such that the first connection line serves to electrically connect the display pixel on the first surface to the second connection line on the second surface. The step of providing a first connection line comprises steps of: (a) forming a through-hole passing through the first and second surfaces of the substrate; and (b) carrying out metallization in the through-hole.

A further understanding of other aspects, features, and advantages of the present invention will be realized by reference to the following description, appended drawings and accompanying drawings.

BRIEF DESCRIPTION OF THE DRAWINGS

The embodiments of the invention will be described with reference to the accompanying drawings, in which:

FIG. 5 is a schematic cross-sectional view taken along the line A—A in FIG. 4 with the pixel electronics omitted;

FIG. 6 is a schematic cross-sectional view taken along the line B—B in FIG. 4 with the pixel electronic omitted;

DETAILED DESCRIPTION OF THE PREFERRED EMBODIMENT(S)

Figure 1:
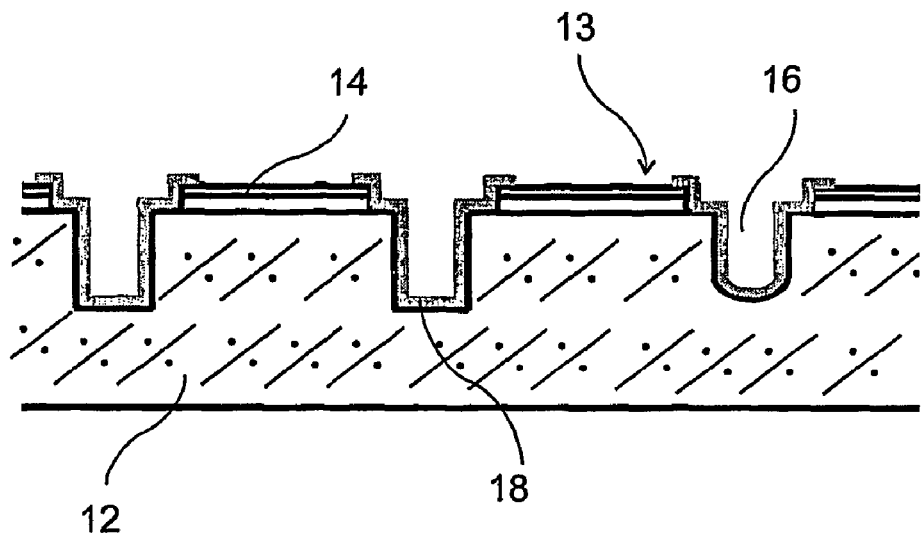
FIG. 1 illustrates a schematic sectional view of a flexible display device according to the first embodiment of the present invention.
Figure 2:
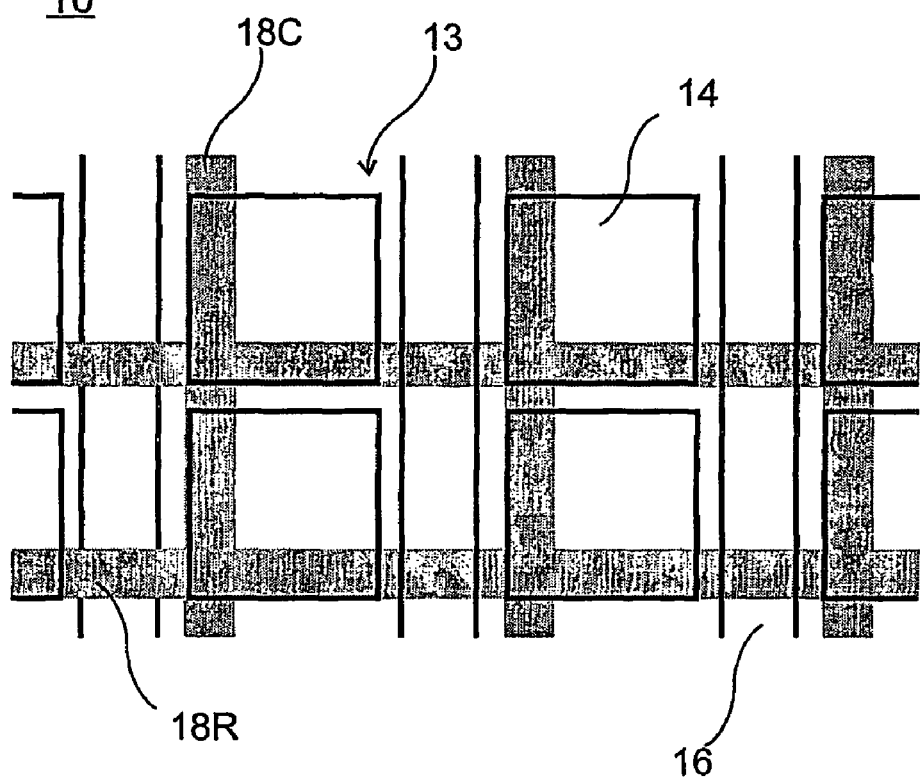
FIG. 2 shows the top view of the flexible display device of FIG. 1.

In FIGS. 1 and 2, there is schematically illustrated a flexible display device in accordance with the first embodiment of the present invention, which is generally denoted by a reference numeral 10. FIG. 1 is the cross-sectional view of the display device, and FIG. 2 illustrates the top plan view thereof.

Referring to FIGS. 1 and 2, the flexible display device 10 comprises a flexible substrate 12 such as a plastic substrate, a plurality of display pixels 14 provided on the surface of the substrate 12, a plurality of grooves 16 formed between the display pixels 14, and a plurality of connection lines 18 for electrically interconnecting the display pixels 14. In this embodiment, the display pixels 14 are arranged in a pattern of plural rows and columns as is shown in FIG. 2. The groove 16 can be formed in between any adjacent rows or columns of the display pixels, for example, in a regular pattern. In this embodiment, the grooves 16 are provided in between every adjacent two columns of display pixels and formed substantially parallel to the columns. The connection lines 18 include a plural of column connection lines 18C and a plural of row connection lines 18R, which serve to electronically interconnect the columns and rows of display pixels respectively, as is illustrated in FIGS. 2. An insulation layer (not shown in FIGS. 1 and 2) is provided between the row and column connection lines 18R and 18C, which are substantially perpendicular to each other.

The grooves 16 define a pixel area 13 in-between where the display pixels 14 are placed. Accordingly, by virtue of the grooves 16, the pixel area 13 is mechanically isolated, and the whole display device 10 is provided with a greater flexibility, especially to the extent that it can be rolled up or folded. The mechanical isolation of the pixel area 13 serves to minimize the stress propagation from the substrate 12 to the pixel area 13, i.e., the display pixels 14 when rolled or bent. That is, the minimal influence on display performance characteristics can be achieved. Therefore, the display device 10 of the invention can be stored in a compact rolled state, for example, in a cylindrical casing, and can be flattened out when in use. Furthermore, the flexible display device 10 can operate even when it remains bent or wrapped around a cylindrical surface.

Figure 7:
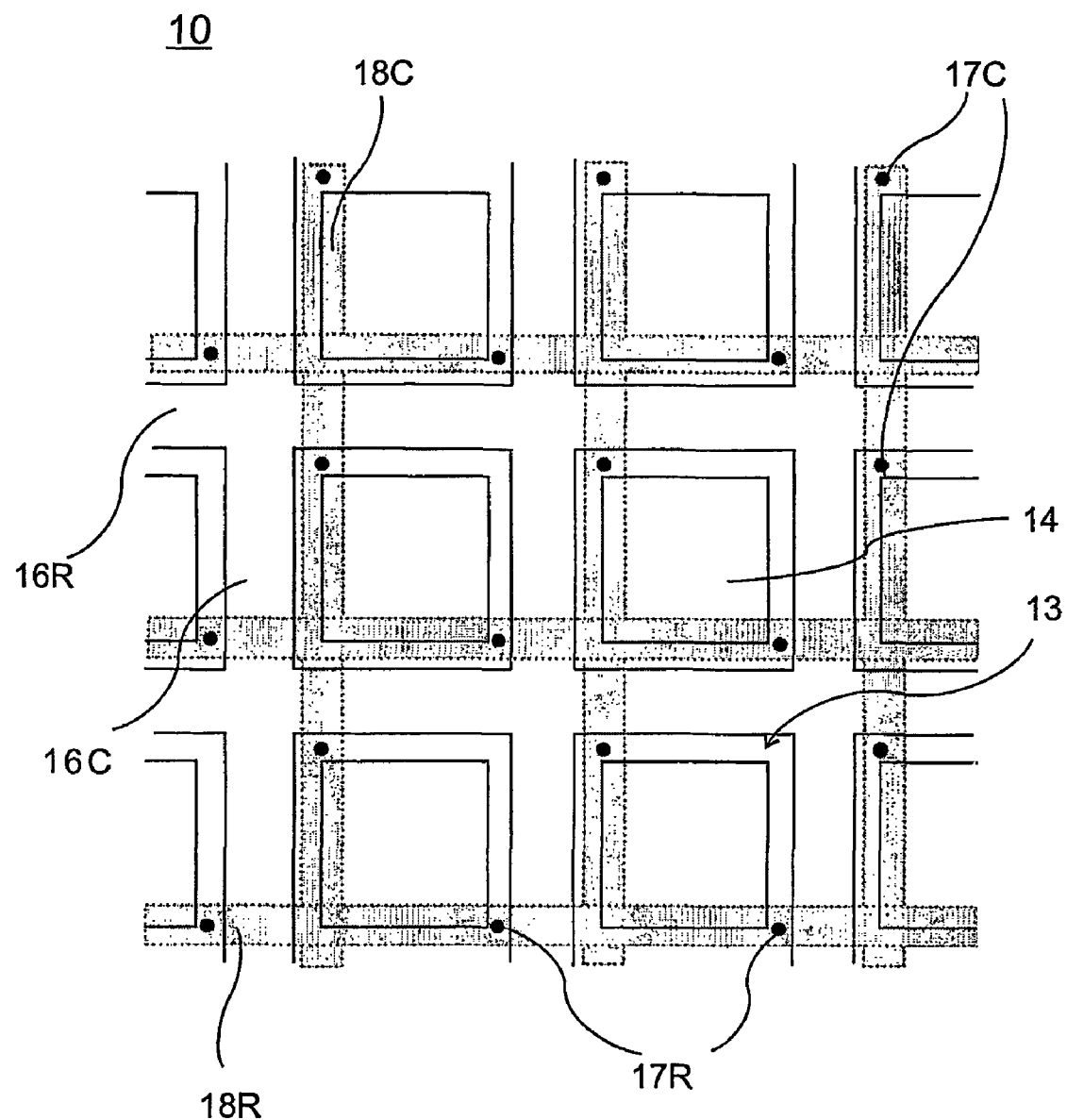
FIG. 7 illustrates a top plan view of a flexible display device according to the third embodiment of the invention.

In the embodiment of FIGS. 1 and 2, although the display device 10 is provided with a plural of columnar grooves 16 only, it can further include a plural of row grooves 16R as illustrated in FIG. 7. Each row groove 16R is provided in between each adjacent two rows of display pixels, thereby improving the flexibility of the display device. The column and row grooves 16C, 16R are substantially perpendicular to each other.

As illustrated in FIG. 1, the grooves 16 can take either a rectangular or rounded cross-section.

Each display pixel 14 includes an electro-luminescent display layer such as a polymer or organic emitting diode (OLED) and pixel electronics such as thin-film-transistor based switching circuitry. The pixel electronics can be integrated in a stacked pixel configuration on the pixel area 13.

Figure 3:
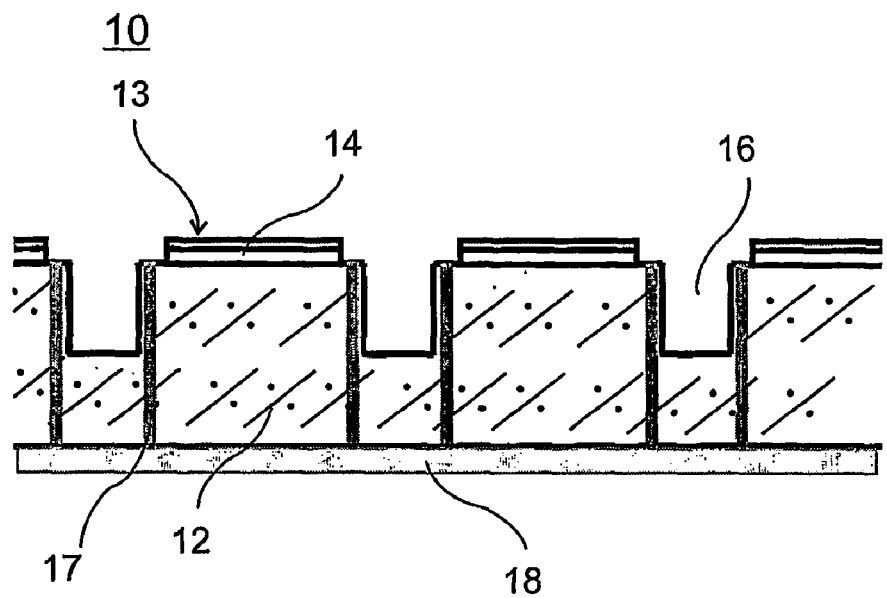
FIG. 3 is a schematic representation of a sectional view of a flexible display device according to the second embodiment of the present invention.
Figure 4:
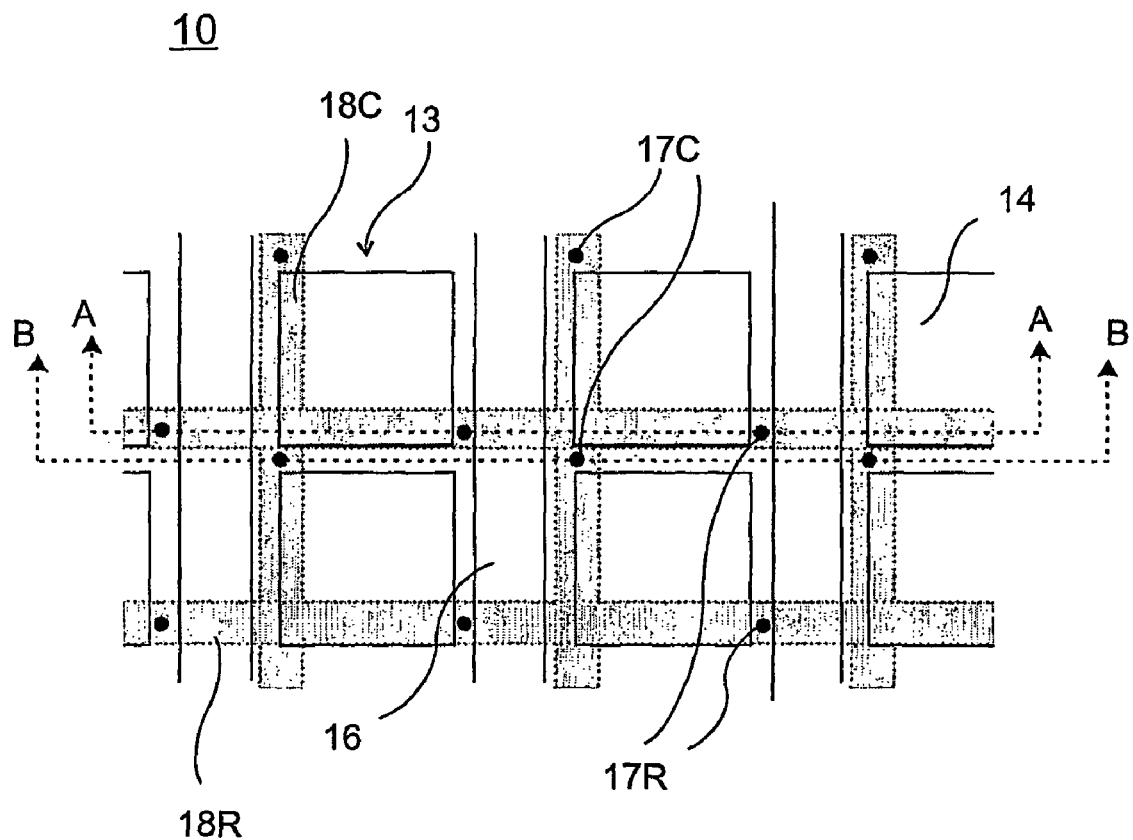
FIG. 4 depicts the top view of the flexible display device of FIG. 3.

FIGS. 3 to 6 schematically depict a flexible display device 10 in accordance with the second embodiment of the present invention. FIG. 3 is the cross-sectional view of the display device, and FIG. 4 illustrates the top plan view thereof. FIGS. 5 and 6 are cross-sectional views taken along the lines A—A and B—B respectively in FIG. 4.

Similar to the previous embodiment of FIGS. 1 and 2, the flexible display device 10 of FIGS. 3 to 6 comprises a flexible substrate 12 such as a plastic substrate, a plurality of display pixels 14 provided on the surface of the substrate 12, a plurality of grooves 16 formed between the display pixels 14, and a plurality of connection lines 17 and 18 for electrically interconnecting the display pixels 14. Likewise, the configuration of the elements is essentially identical in both embodiments, except for that of the connection lines.

Referring to FIGS. 3 to 6, the structure of the connection line of this embodiment will be described hereafter in greater detail.

In this embodiment, the connection line for electrically interconnecting the display pixels comprise a plural of row connection lines 18R, a plural of column connection lines 18C, and a plural of vertical connection lines 17. According to this embodiment, the row and column connection lines 18R and 18C are provided on the opposite side to the surface of the substrate 12 where the display pixels 14 are disposed. An insulation layer 19a is provided between the row and column connection lines 18R, 18C, as clearly illustrated in FIGS. 5 and 6. The vertical connection line 17 serves to connect each display pixel 14, for example a pixel contact 15 (on which the display pixel is integrated) with each corresponding row or column connection lines. More specifically, the vertical connection line 17 includes a column vertical connection line 17C and a row vertical connection line 17R. In this embodiment, each display pixel 14 is provided with a row vertical connection line 17R and a column vertical connection line 17C, which electronically connect the display pixel 14 to a corresponding row and column connection lines 18R, 18C respectively, as clearly depicted in FIGS. 5 and 6. Further detail of the connection lines 17, 18 will be described hereinafter, in conjunction with manufacturing processes of the flexible display of the invention.

In FIG. 7, there is schematically shown a top plan view of a flexible display device in accordance with the third embodiment of the invention. As noted above and illustrated in FIG. 7, the display device of the invention can be further provided with a plurality of row grooves 16R together with a plurality of column grooves 16C, thereby improving the flexibility of the display device. Likewise, each row groove is formed in between each adjacent two rows of display pixels 14.

According to another embodiment of the invention, there is provided a method of manufacturing the flexible display devices described above. The method, in general, includes a step of forming a number of parallel grooves in the surface of a flexible substrate, such that a columnar pixel area is defined between each adjacent two grooves as illustrated in FIGS. 2 and 4. The parallel grooves can consist of a plurality of parallel row grooves and a plurality of parallel column grooves. In this case, each adjacent two row grooves define an isolated pixel area in combination with each adjacent two column grooves, as shown in FIG. 7. According to the method, then, a number of display pixels are provided on the pixel area defined between the grooves such that the display pixels are arranged in a form of parallel rows and columns, and the row and column of pixels are parallel with the row and column grooves respectively. The method of the invention also includes a step of forming a connection line to electronically interconnect the display pixels, depending on the design of the display device. Details of the above steps will be described hereinafter, in conjunction with FIGS. 8a to 9r.

It is noted that the order of the steps of the method, which is described above and will be further described hereafter, can be switched with each other, depending on the design of the display, or under certain manufacturing conditions and circumstances.

In FIGS. 8a to 8j, there is sequentially and schematically illustrated a method of manufacturing a flexible display device in accordance with the fourth embodiment of the invention. The method will be explained in greater detail hereafter.

Figure 8A:
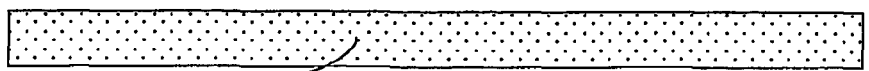
FIGS. 8a to 8j sequentially illustrate a manufacturing process of the flexible display device in accordance with the fourth embodiment of the invention.
Figure 8B:
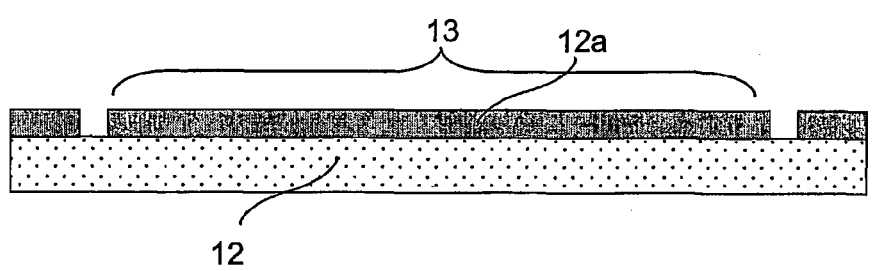
Figure 8C:
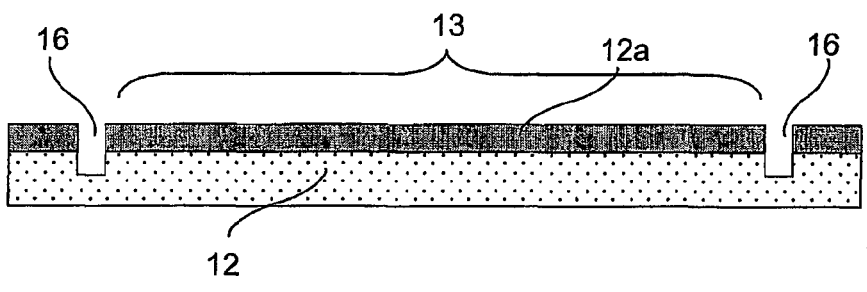
Figure 8D:
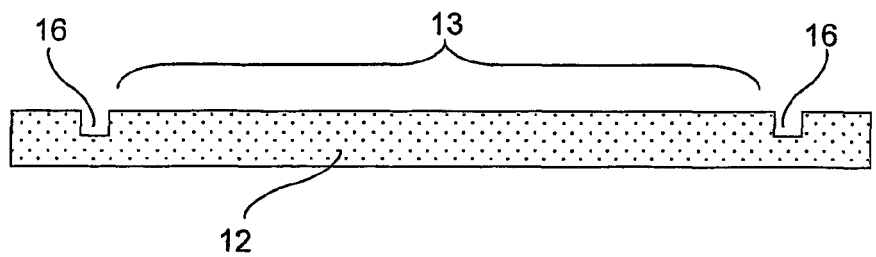
Figure 8E:
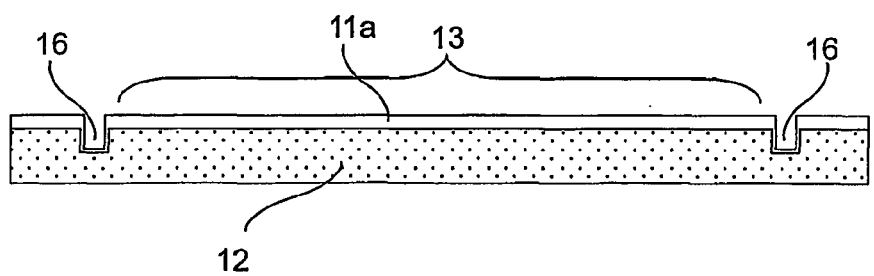
Figure 8F:
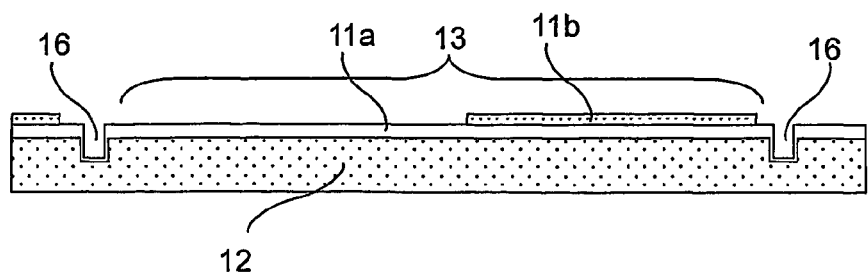
Figure 8G:
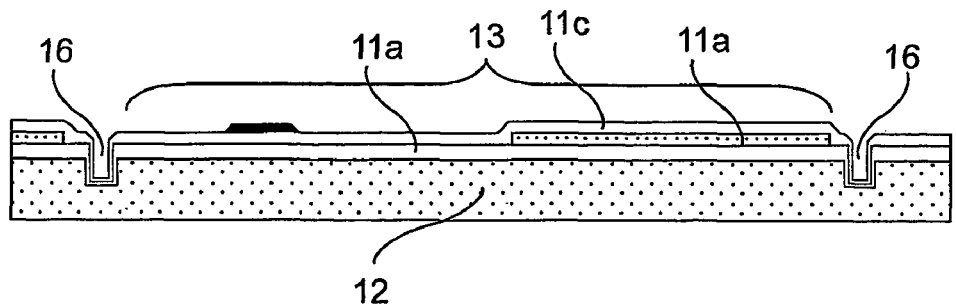
Figure 8H:
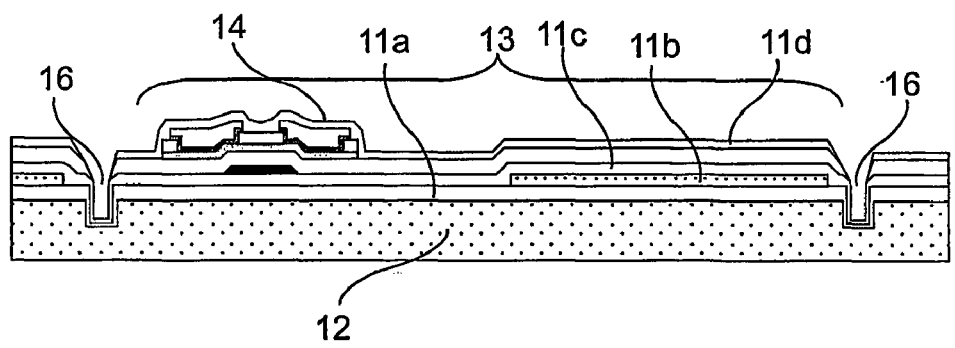
Figure 8I:
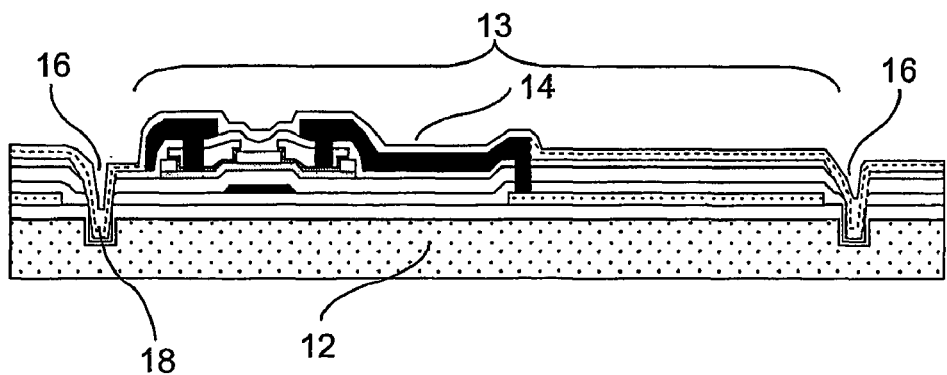
Figure 8J:
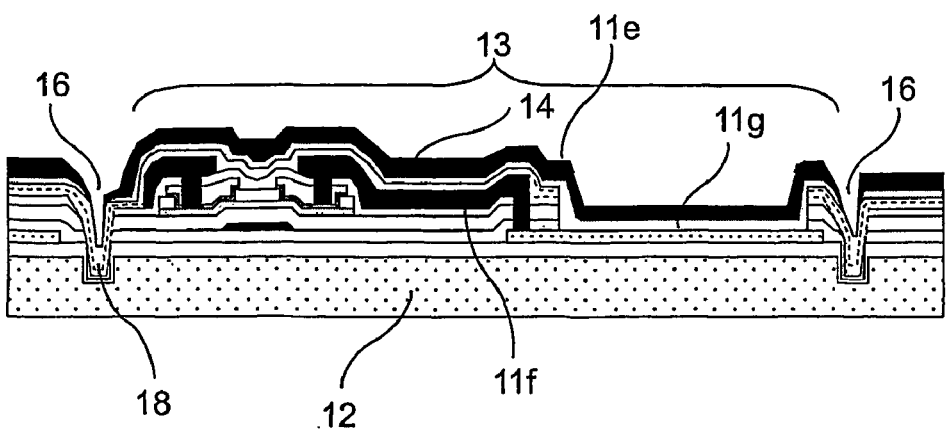

FIGS. 8a to 8d show, in sequence, a process of forming a plurality of grooves in the surface of a flexible substrate 12. For convenience of the illustration and description, there is shown only two parallel grooves 16, between which a pixel area 13 is defined. The grooves 16 can be formed in the flexible plastic substrate 12 by using, for example, a metal (or other) masking technique and reactive ion etching (RIE) process in an atmosphere of $CF_4+O_2$ mixture. That is, a thin-film metal 12a is first deposited on the flexible substrate 12 and then patterned according to a desired outline and dimensions of the grooves as shown in FIG. 8b. Then, the metal-patterned substrate is transferred into a RIE chamber, where the area of the substrate surface which is free from the metal 12a is etched and eventually results in the grooves 16 as depicted in FIG. 8c. After RIE-etching of the substrate, the metal mask 12a is removed by using a wet etchant, or the like as shown in FIG. 8d. Alternatively, the grooves in the plastic substrate can be formed by means of a laser micromachining process or a projection laser micromachining process, which are well-known in the art.

Depending on the requirements of pixel size and the desired degree of bending (radius of curvature), the depth and width of the grooves can be controlled during the above processes such that the mechanical integrity of the substrate can be maintained while minimizing the influence on display performance characteristics.

FIGS. 8e to 8j sequentially illustrate the step of providing a display pixel 14 and a connection line 18 between adjacent pixels. As well-known in the art, the display pixel 14 associates various pixel electronics, including conducting layers, several dielectric layers 11a, 11c and 11d, and can electrode 11b, a source and drain metal 11f, an OLED (Organic Light Emitting Diode) cathode 11e, an organic layer 11g, or the like. Although an OLED device is illustrated as a display pixel, various other types of pixel devices can be integrated together with other necessary components. The above display pixel and related components, and the connection line 18 can be formed by means of various conventional semiconductor processes such as lithography or the like.

Figure 9A:
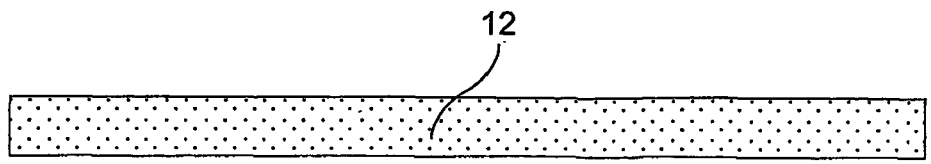
FIGS. 9a to 9r show sequential steps of a manufacturing process of the flexible display device in accordance with the fifth embodiment of the invention.
Figure 9B:
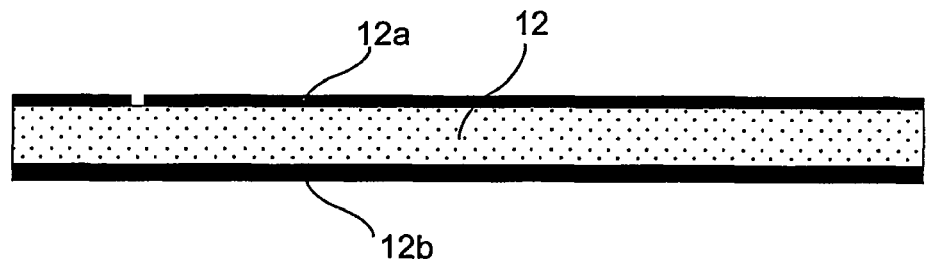
Figure 9C:
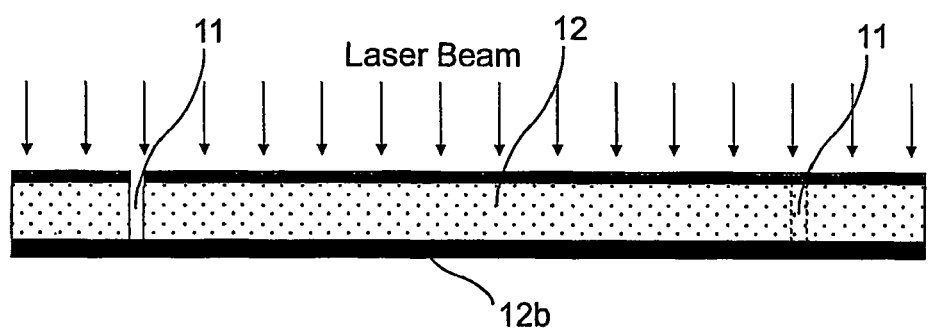
Figure 9D:
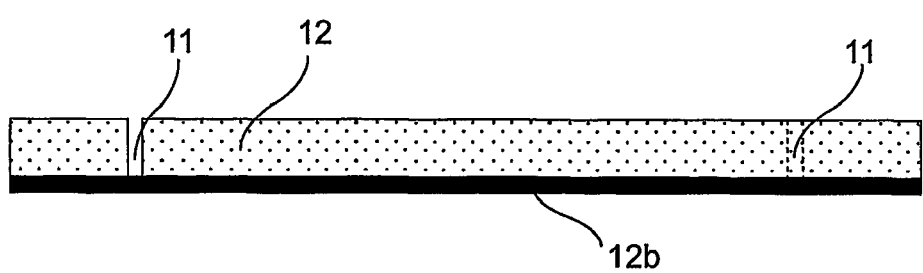
Figure 9E:
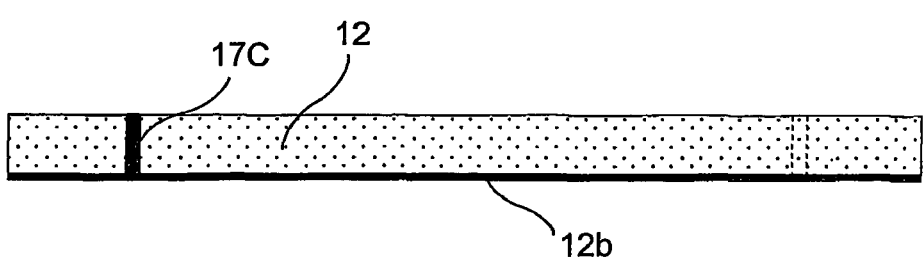
Figure 9F:
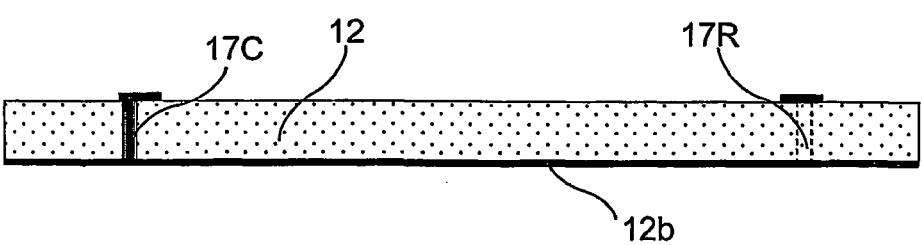
Figure 9G:
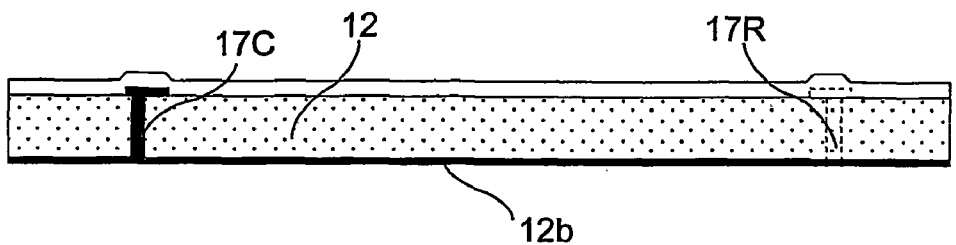
Figure 9H:
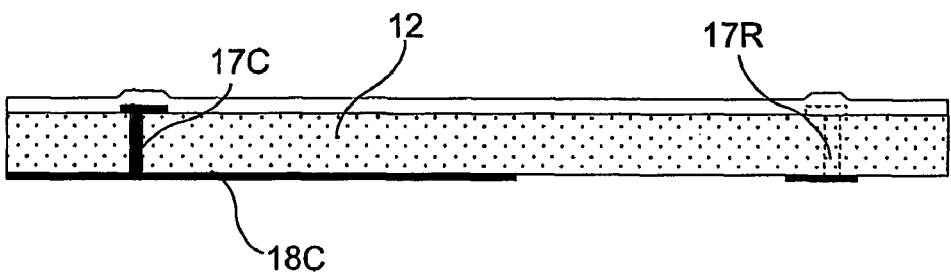
Figure 9I:
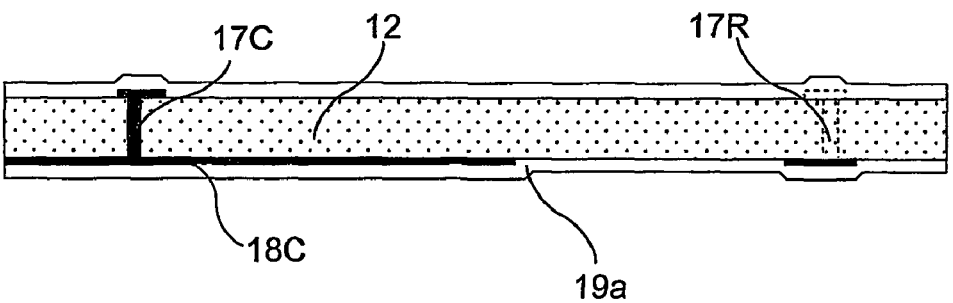
Figure 9J:
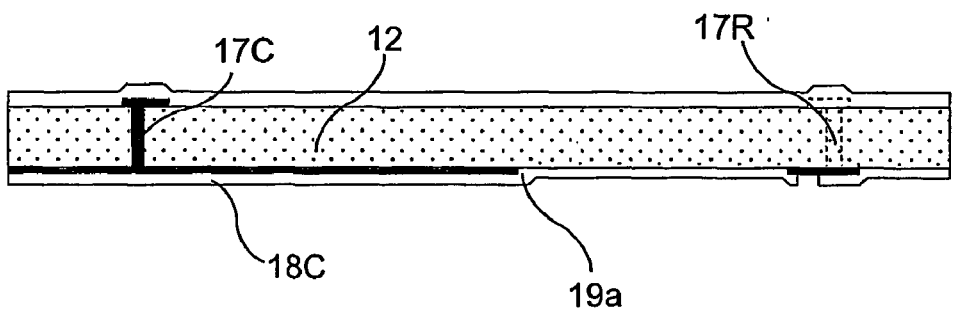
Figure 9K:
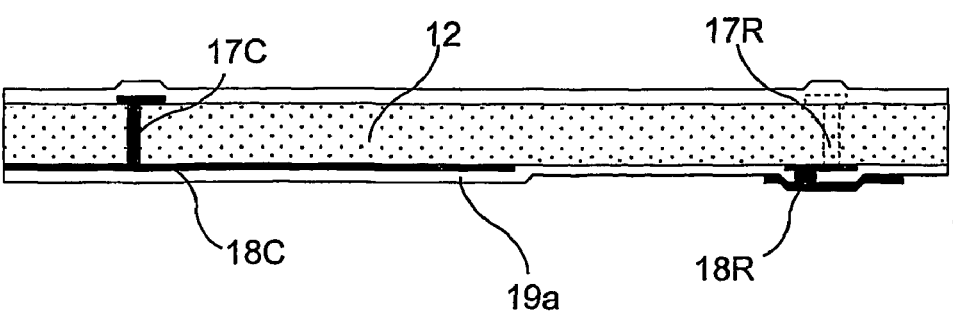
Figure 9L:
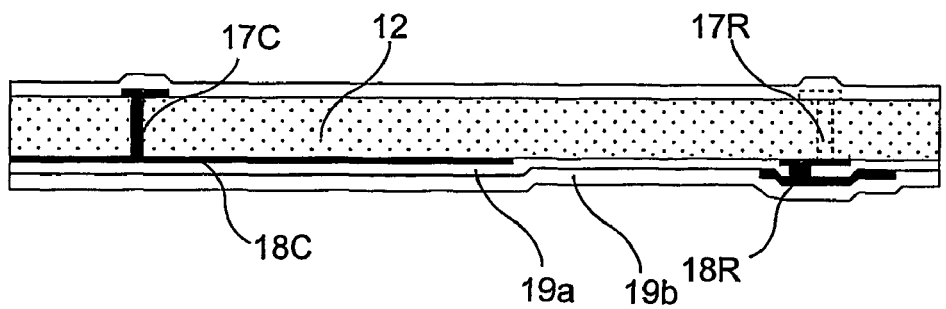
Figure 9M:
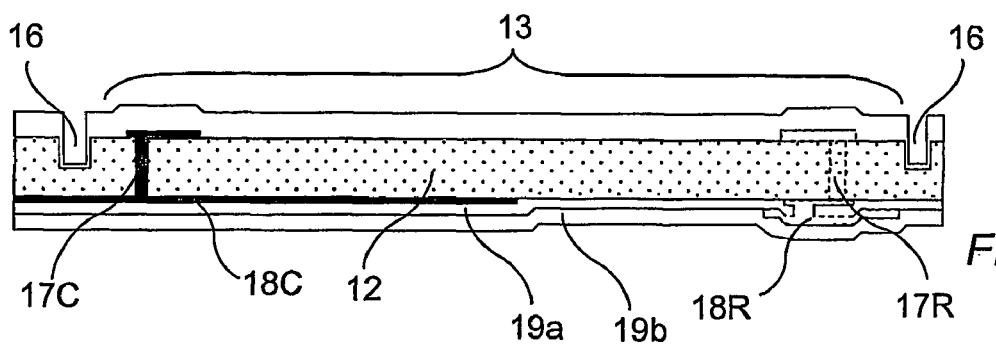
Figure 9N:
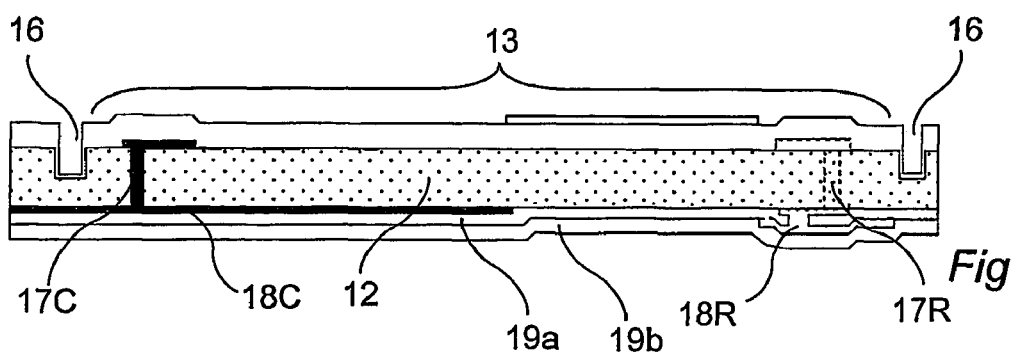
Figure 9O:
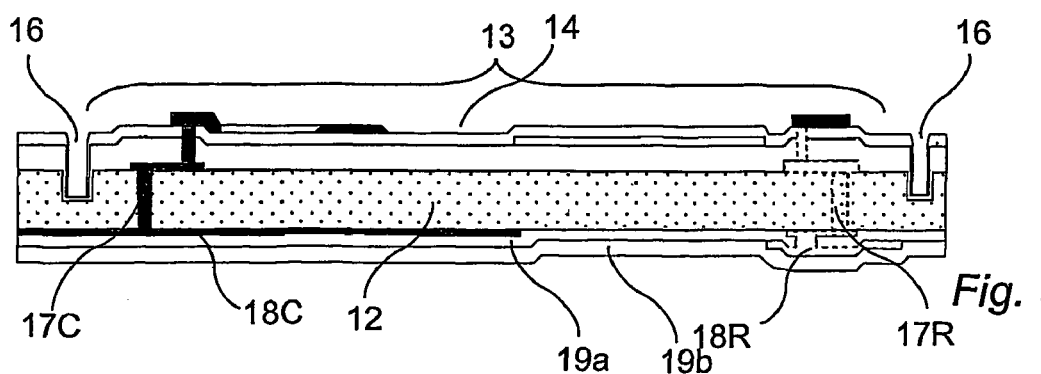
Figure 9P:
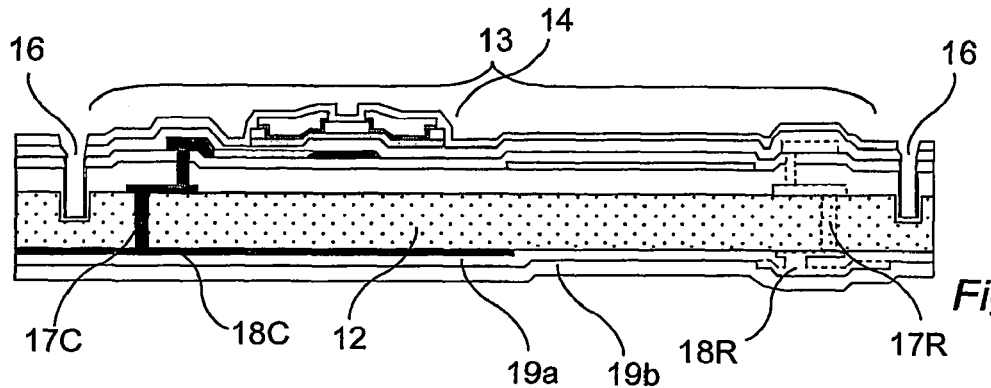
Figure 9Q:
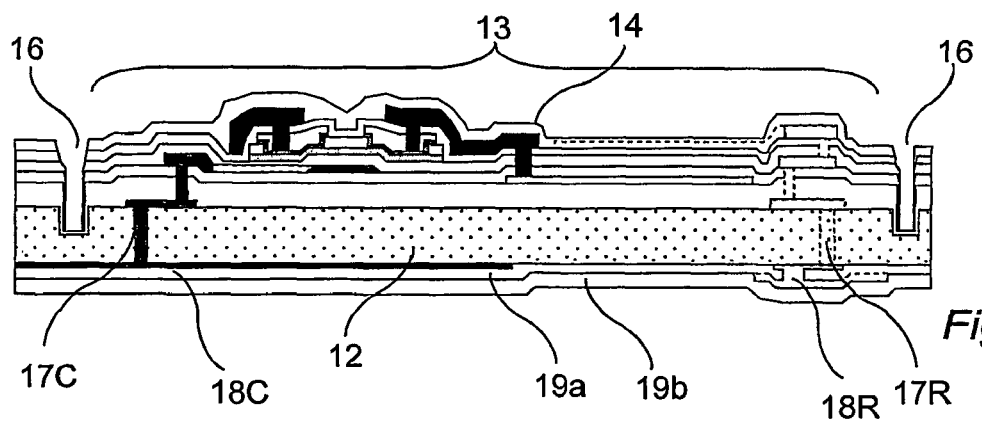
Figure 9R:
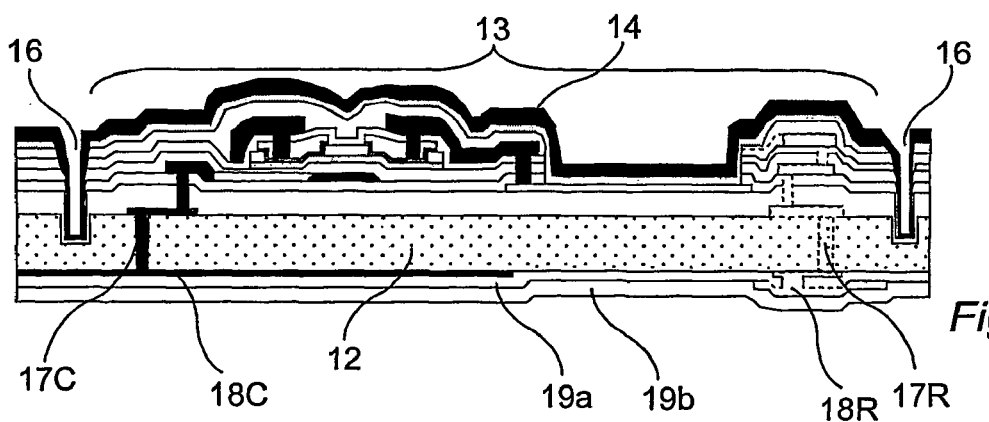

In FIGS. 9a to 9r, there is sequentially and schematically illustrated a method of manufacturing a flexible display device in accordance with the fifth embodiment of the invention. The method will be explained in greater detail, referring to the flexible display device shown in FIGS. 3 to 6.

In this embodiment, the step of forming a connection line between the display pixels is different from that of the previous one. Other steps are essentially identical with those of the previous embodiment. That is, the step of forming the connection lines includes steps of providing a first connection line perforating a flexible substrate, and providing a second connection line on the opposite side to the surface of the substrate where the display pixels are placed, such that the first connection line serves to electrically connects the display pixel on the surface to the second connection line. In the figures, the first connection line is denoted by reference numerals 17C or 17R, and the second connection line by 18C or 18R. The first connection lines 17C, 17R correspond to the vertical connection lines 17C, 17R in FIGS. 3 to 6.

According to this embodiment of the invention, the step of providing a first connection line comprises steps of forming a through-hole passing through the substrate, and carrying out metallization in the through-hole.

FIGS. 9a to 9f show the forming procedures of a first connection line 17C or 17R. As illustrated in FIGS. 9a to 9d, the step of making a through-hole 11 is similar to the groove forming process described above in conjunction with FIGS. 8a to 8d. That is, a metal masking and patterning process and a reactive ion etching (RIE) process, a laser micromachining process, or a projection laser micromachining process can be utilized, which are well-known processes in the art. A metal layer 12b such as an Al layer is provided on the opposite side to the substrate surface where the metal masking 12a is deposited. The metal layer 12b is used for providing the second connection lines 18C and 18R in subsequent steps of the method.

FIGS. 9e and 9f schematically illustrate the step of metallizing the through-holes 11 to forming the first connection lines 17C and 17R. Various conventional processes can be used for metallization of the through-holes 11, including an electro- or electroless deposition process.

In FIGS. 9g to 9l, there is schematically depicted the step of providing the second connection lines 18C and 18R. Specifically, as shown in FIG. 9h, by patterning the metal layer 12b, a second connection line 18C is formed, which corresponds to the column connection line in FIGS. 4 to 6. Then, a first insulation layer 19a such as a dielectric layer is deposited over the second connection line 18C. As illustrated in FIGS. 9j to 9l, opening vias in the insulation layer 19a, and deposition and patterning another metal layer are carried out to provide another second connection line 18R, which corresponds to the row connection line in FIGS. 4 to 6. Then another insulation layer 19b such as a dielectric encapsulation layer is provided above the second connection line 18R, as shown in FIG. 9l.

Subsequently, as shown in FIG. 9m, the grooves 16 are formed by means of the same processes noted above, in conjunction with the previous embodiment of FIGS. 8a to 8j. The grooves 16 define a pixel area 13.

Similar to FIGS. 8e to 8j, FIGS. 9n to 9r schematically and sequentially illustrate the step of providing a display pixel 14. As well-known in the art, the display pixel 14 associates various pixel electronics, including conducting layers, several dielectric layers, a electrode, a source and drain metal, an OLED cathode, an organic layer, or the like. Although an OLED device is illustrated as a display pixel, various other types of pixel devices can be applied to the present invention. The above display pixel and related components can be formed by means of various conventional semiconductor processes such as lithography or the like.

While this invention has been described with reference to several specific embodiments, the description is illustrative of the invention and is not to be construed as limiting the invention. Various modifications and variations may occur to those skilled in the art without departing from the true spirit and scope of the invention as defined by the appended claims.

What is claimed is:

1. A flexible display device comprising:
   (a) a flexible substrate having a first and second surfaces;
   (b) a plurality of display pixels arranged in a form of rows and columns on the first surface of the substrate;

(c) a plurality of first parallel grooves in the first surface of the substrate, the first groove being formed in between adjacent two rows or columns of the display pixels, thereby providing flexibility to the display device and, at the same time, minimizing the propagation of mechanical stress caused when the display device is bent or rolled; and (d) a plurality of connection lines for electrically interconnecting the plurality of display pixels wherein part of the connection lines is provided on the second surface of the substrate.

2. A flexible display device according to claim 1, further comprising a plurality of second parallel grooves, each of which is formed in between adjacent two columns or rows of the display pixels thereby enhancing the flexibility of the display device, the first and second grooves being substantially perpendicular to each other.

3. A flexible display device according to claim 1, wherein each first groove is provided in between each adjacent rows or columns of the display pixels.

4. A flexible display device according to claim 1, wherein the connection lines comprise:
   (a) a plurality of row connection lines provided on the second surface of the substrate, each row connection line corresponding to each respective row of display pixels;
   (b) a plurality of column connection lines provided on the second surface of the substrate, each column connection line corresponding to each respective column of display pixels; and
   (c) a plurality of vertical connection lines each connecting each display pixel on the first surface with a corresponding row or column connection line on the second surface, wherein an insulation layer is provided between the row and column connection lines.

5. A flexible display device according to claim 4, wherein the vertical connection line includes a column vertical connection line and a row vertical connection line, which connect a display pixel to a corresponding column and row connection lines respectively.

6. A flexible display device according to claim 4, wherein each display pixel is provided with a column vertical connection line and a row vertical connection line, which connect the display pixel to a corresponding column and row connection line respectively.

7. A method of manufacturing a flexible display device, the method comprising the steps of:
   (a) providing a flexible substrate having a first and second surface;
   (b) forming a plurality of first parallel grooves in the first surface of the substrate, each adjacent two parallel grooves defining a pixel area therebetween;
   (c) providing a plurality of display pixels on the pixel area such that the display pixels are arranged in a pattern of rows and columns; and
   (d) providing a plurality of connection lines to electrically interconnect the display pixels comprising:
      (i) providing a first connection line to connect the first surface with the second surface of the substrate; and
      (ii) providing a second connection line on the second surface of the substrate such that the first connection line serves to electrically connects the display pixel on the first surface to the second connection line on the second surface.

8. A method according to claim 7, further comprising a step of forming a plurality of second parallel grooves in the first surface of the substrate such that the second groove is substantially perpendicular to the first groove.

9. A method according to claim 7, wherein, in the step of forming a plurality of first parallel grooves, the grooves are formed by means of a metal masking and patterning process and a reactive ion etching (RIE) process.

10. A method according to claim 7, wherein, in the step of forming a plurality of first parallel grooves, the grooves are formed by means of a laser micromachining process or a projection laser micromachining process.

11. A method according to claim 7, wherein the step of providing a first connection line comprises steps of:
   (a) forming a through-hole passing through the first and second surfaces of the substrate; and
   (b) carrying out metallization in the through-hole.

\* \* \* \* \*